US009049501B2

(12) United States Patent
Delpapa et al.

(10) Patent No.: US 9,049,501 B2
(45) Date of Patent: Jun. 2, 2015

(54) AUDIO SYSTEM WITH SYNTHESIZED POSITIVE IMPEDANCE

(75) Inventors: Kenneth B. Delpapa, Natick, MA (US); Michael B. Nussbaum, Newton, MA (US); Jay N. Teixeira, Boxborough, MA (US); George Nichols, Dover, MA (US); Thomas A. Froeschle, Southborough, MA (US)

(73) Assignee: Bose Corporation, Framingham, MA (US)

( * ) Notice: Subject to any disclaimer, the term of this patent is extended or adjusted under 35 U.S.C. 154(b) by 561 days.

(21) Appl. No.: 13/550,887

(22) Filed: Jul. 17, 2012

(65) Prior Publication Data

US 2013/0182859 A1 Jul. 18, 2013

Related U.S. Application Data

(62) Division of application No. 11/681,621, filed on Mar. 2, 2007, now Pat. No. 8,224,009.

(51) Int. Cl.

*H03F 99/00* (2009.01)
*H04R 3/00* (2006.01)
*H04R 1/28* (2006.01)

(52) U.S. Cl.

CPC ................ *H04R 3/00* (2013.01); *H04R 1/2819* (2013.01); *H04R 1/2834* (2013.01); *H04R 3/002* (2013.01); *H04R 2201/028* (2013.01)

(58) Field of Classification Search

CPC ............... H03F 1/34; H03F 1/56; H04R 3/04; H04R 3/08
USPC .......................................................... 381/121
See application file for complete search history.

(56) References Cited

U.S. PATENT DOCUMENTS 5,226,089 A * 7/1993 Yoon et al. ...................... 381/96
5,636,284 A * 6/1997 Pritchard ........................ 381/61
7,157,968 B2 * 1/2007 Shin .............................. 330/251
7,254,229 B2 * 8/2007 Apfel ............................ 379/398
7,702,120 B1 * 4/2010 Ferstenberg ................. 381/121

* cited by examiner

*Primary Examiner* — Jeffrey Zweizig

(57) ABSTRACT

An electrical apparatus to sense current through a load includes a first input terminal having a first input voltage relative to a reference, a second input terminal having a second input voltage relative to the reference, a first load terminal of the load having a first load voltage relative to the reference, a second load terminal of the load having a second load voltage relative to the reference, a first current sensing element connected between the first input terminal and the first load terminal and a second current sensing element connected between the second input terminal and the second load terminal. A first sense voltage is determined by a relationship between the first input voltage and the second load voltage and a second sense voltage is determined by a relationship between the second input voltage and the first load voltage.

18 Claims, 5 Drawing Sheets

AUDIO SYSTEM WITH SYNTHESIZED POSITIVE IMPEDANCE

This application is a divisional application of, and claims priority to, U.S. Pat. No. 8,224,009, which is incorporated herein by reference.

BACKGROUND

This specification relates in general to audio reproduction systems that have amplifiers and loudspeakers.

SUMMARY

In general, in one aspect, an audio system apparatus includes an audio power amplifier, a transducer electrically connected to the audio power amplifier, an enclosure coupled to the transducer, and a secondary resonant element coupled to the enclosure. An electrical feedback signal representative of the transducer current is negatively fed back to the audio power amplifier to synthesize a positive output impedance.

Implementations may include one or more of the following features. The audio power amplifier may be a switching amplifier. The synthesized positive output impedance may be lossless. The synthesized positive output impedance may be positive over an entire operation range of the transducer. The electrical feedback signal may be produced by a current sensor such as a resistor, a Hall Effect sensor, a closed loop magnetic sensor, a current sensing transformer, or a sensing-field-effect transistor. The electrical feedback signal may be used by the audio power amplifier to reduce the Q of a secondary resonant system that includes the enclosure and the secondary resonant element. The secondary resonant element may include a port. The secondary resonant element may include a drone. The enclosure may be coupled to the first or second side of the transducer. There may also be a second enclosure coupled to the second side of the transducer and a second secondary resonant element coupled to the second enclosure. The synthesized positive output impedance of the audio power amplifier may be used to reduce the drone excursion. The synthesized positive output impedance may be in the range of 0.1 ohm to 100 ohms.

In general, in one aspect, an audio system apparatus includes an audio power amplifier, a transducer electrically connected to the audio power amplifier, and an enclosure comprising a waveguide coupled to the transducer. An electrical feedback signal representative of the transducer current is negatively fed back to the audio power amplifier to synthesize a positive output impedance.

Implementations may include one or more of the following features. The audio power amplifier may be a switching amplifier. The synthesized positive output impedance may be lossless. The enclosure may be coupled to the first or second side of the transducer. The enclosure may be coupled to the second side of the transducer, a second enclosure may be coupled to the first side of the transducer and a secondary resonant element may be coupled to the second enclosure. The second enclosure may include a waveguide.

In general, in one aspect, a method for reproducing sound includes amplifying an electrical audio signal, applying the amplified electrical signal to a loudspeaker system that includes a transducer, an enclosure and a secondary resonant system, and using an electrical feedback signal representative of the current flowing through the transducer to synthesize a positive output impedance for the amplifying.

Implementations may include one or more of the following features. The synthesized positive output impedance may be used to reduce drone excursion. The synthesized positive output impedance may be lossless.

In general, in one aspect, an electrical apparatus to sense current through a load includes a first input terminal having a first input voltage relative to a reference, a second input terminal having a second input voltage relative to the reference, a first load terminal of the load having a first load voltage relative to the reference, a second load terminal of the load having a second load voltage relative to the reference, a first current sensing element connected between the first input terminal and the first load terminal, and a second current sensing element connected between the second input terminal and the second load terminal. A first sense voltage is determined by a relationship between the first input voltage and the second load voltage and a second sense voltage is determined by a relationship between the second input voltage and the first load voltage.

Implementations may include one or more of the following features. The reference may be a circuit common, a circuit ground, or an earth connection. The first current sensing element may be a resistive element. The first current sensing element may have essentially zero resistance. There may be a set of two resistive elements that form a voltage divider and the first sense voltage may be sensed by the voltage divider. The two resistive elements may have approximately equal resistance. The first input voltage and the second input voltage may have a substantially constant common mode voltage. The average of the first input voltage and the second input voltage may be substantially constant over a range of operation. There may be a voltage difference amplifier that senses the difference of the first sense voltage and the second sense voltage. The voltage difference amplifier may have a common mode range smaller than the voltage range of the first input voltage. There may be a bridge amplifier with bridge amplifier outputs where the first and second input voltages are derived from the bridge amplifier outputs. The bridge amplifier outputs may be modified by a filter and coupled to the first input terminal and the second input terminal. The load may include a transducer. There may be an audio amplifier. The audio amplifier may include a switching amplifier. The load may include a transducer coupled to a bass reflex enclosure. The load may include a transducer coupled to a waveguide enclosure. There may be an electrical filter module coupling the first current sensing element to the load.

DETAILED DESCRIPTION

Figure 1:
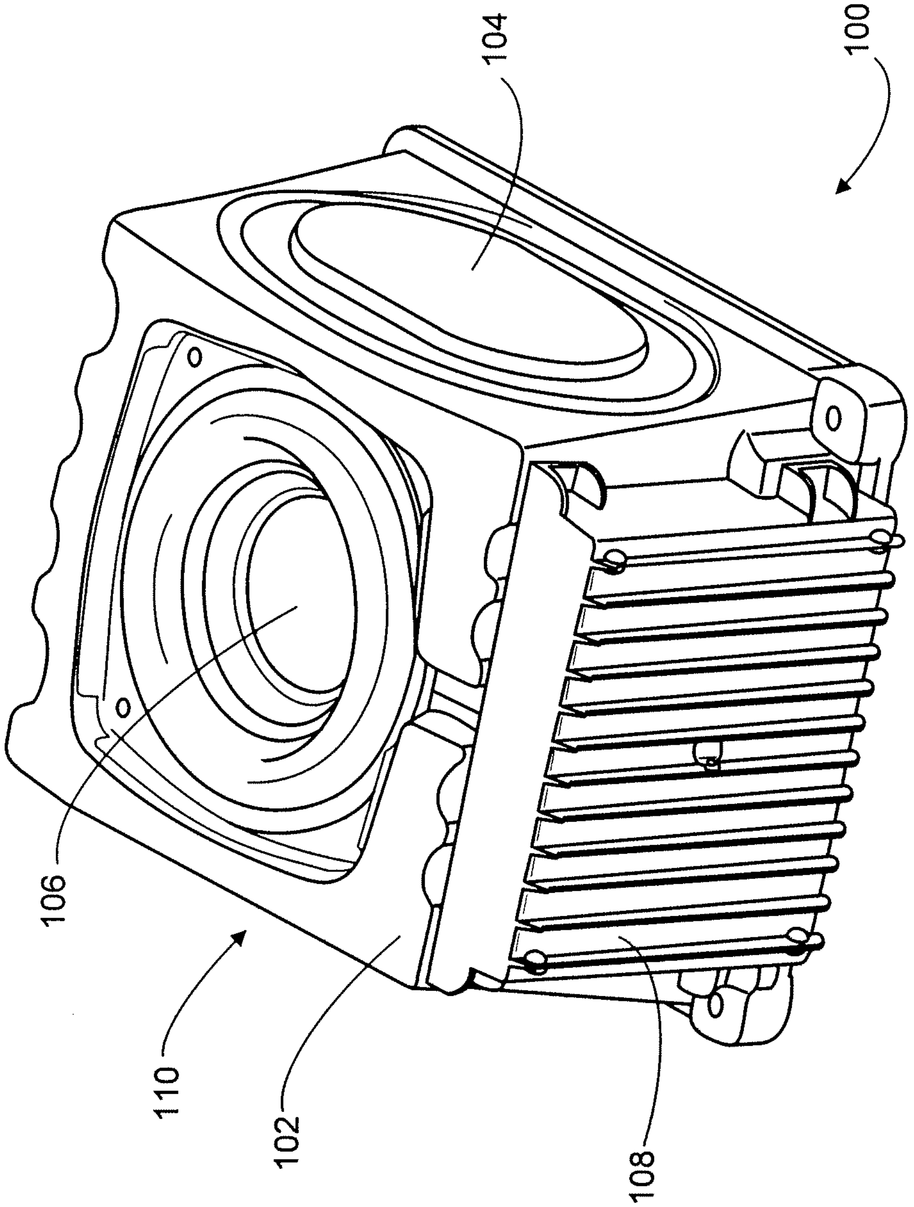
FIG. 1 is a drawing of a speaker module.

The Q of a resonant system compares the frequency at which a system oscillates to the rate at which it dissipates its energy. On a spectral graph of the resonant system, the width of the resonant peak is given by the center frequency of resonance (also called resonant frequency) divided by the Q.

In some embodiments, a loudspeaker includes a transducer such as a moving coil or moving magnet transducer, which converts input electrical power into mechanical motion of a diaphragm, and an enclosure to constrain radiation from at least one side of the diaphragm, and at least a first secondary resonant element. Bass reflex loudspeakers utilize the sound from the rear of a transducer diaphragm (in addition to sound from the front of the diaphragm) to increase the efficiency of the system at low frequencies as compared to a closed-box loudspeaker. Bass reflex enclosures incorporate a secondary resonant element such as a drone or port. A drone may be considered a simplified form of a transducer that has some of the moving parts of the transducer but no electrical parts. A drone is also known as a passive radiator. The Q of a bass reflex audio system can be changed by adjusting the amplifier's output impedance. By synthesizing positive output impedance, the amplifier can reduce the Q of the bass reflex system. The secondary resonant element above interacts with the volume of air in the enclosure to form a secondary resonant system. The secondary resonant system has a resonant behavior that is separate from the transducer. The Q of this secondary resonant system can be modified by altering the output impedance of an amplifier that drives the loudspeaker system. Increasing the output impedance of the amplifier can reduce the Q of the secondary system resonance.

In other embodiments, additional resonant elements may be used. For example, an enclosure and port or drone may be coupled to the front or first side of a transducer diaphragm, and a second enclosure and port or drone, separate from the first port or drone, may be coupled to the rear or second side of a transducer diaphragm. In some embodiments, a waveguide enclosure may be coupled to the front, to the rear, or both the front and rear sides of a transducer diaphragm. Waveguide enclosures have multiple resonances at frequencies where standing waves are supported within the waveguide. Other embodiments may use combinations of enclosures, ports or drones, and waveguide enclosures. Increasing the output impedance of an amplifier driving the transducers in these embodiments can reduce the Q of the secondary system resonances and waveguide resonances.

In passive loudspeaker systems, a designer will typically choose parameters for a transducer to achieve desired damping of secondary resonances, to achieve a desired frequency response. By choosing the efficiency, a designer can control the Q of secondary resonances. To lower the Q, a designer needs to reduce the efficiency of the transducer. It was described earlier that increasing the output impedance of the amplifier driving a loudspeaker with secondary resonances can be used to reduce the Q of secondary resonances. Increasing the output impedance of the driving amplifier allows a much more efficient transducer to be used than would be typical. Using a high efficiency transducer in loudspeaker embodiments with secondary resonances would typically result in high Q resonances and non optimal output frequency response. The Q's of the secondary resonances are controlled using negative current feedback to increase amplifier output impedance, so that the Q's can be reduced to desirable levels. This allows high efficiency transducers to be used in systems that would otherwise result in unacceptable frequency responses.

When negative current feedback is used to synthesize a positive output impedance for an analog (i.e. linear) amplifier, the effect is similar to placing a physical resistor electrically in series with the output of the analog amplifier without feedback. With a resistor in series with the output, there is a voltage divider effect between the resistor and the load (e.g. the loudspeaker). Some of the available amplifier power is dissipated in the resistance, some in the load. When negative current feedback is applied to the analog amplifier, however, rather than dissipating power in a physical resistor, power ends up being dissipated in the amplifier output stage. When a high efficiency transducer is used with an analog amplifier and negative current feedback, the benefit of using a transducer with increased efficiency is offset by the extra power dissipated in the amplifier output stage. The feedback does still provides useful control over system frequency response, and compensates for parameter variation in the system (as explained later), but overall efficiency is not substantially improved.

A further benefit is obtained when negative current feedback is used to synthesize a positive output impedance for a switching type amplifier used to drive a loudspeaker system according to one of the previously described embodiments. The efficiency of the transducer is chosen to be as high as practical. Negative current feedback is used to synthesize a positive output impedance, to provide damping for secondary system resonances. Unlike in the analog amplifier case, however, the power dissipated in the output devices of a switching amplifier does not appreciably change when negative current feedback is applied. The synthesized positive output impedance of the switching amplifier does not effectively dissipate any power, other than through switching and conduction losses in the output devices which do not appreciably change whether or not current feedback is used. We will refer to the synthesized output impedance with the above mentioned characteristic as being lossless, even though there is some finite power dissipated in the output devices. System efficiency is greatly increased because the choice of transducer parameters is decoupled from the need to reduce Q of secondary resonant elements to achieve a desired frequency response. The Q's are reduced to a desired value by use of synthesized positive output impedance that does not dissipate real power, preserving system efficiency while obtaining the desired frequency response.

Referring to FIG. 1, there is shown a drawing of a speaker module 100. Speaker module 100 produces sound from an amplified electrical audio signal. Speaker module 100 includes enclosure 102, drones 104 and 110, transducer 106, and amplifier 108. Only one drone 104 is visible in FIG. 1. Drone 110 is located on the wall opposite the wall the visible drone is mounted in. Amplifier 108 is attached to the outside of enclosure 102.

Figure 2:
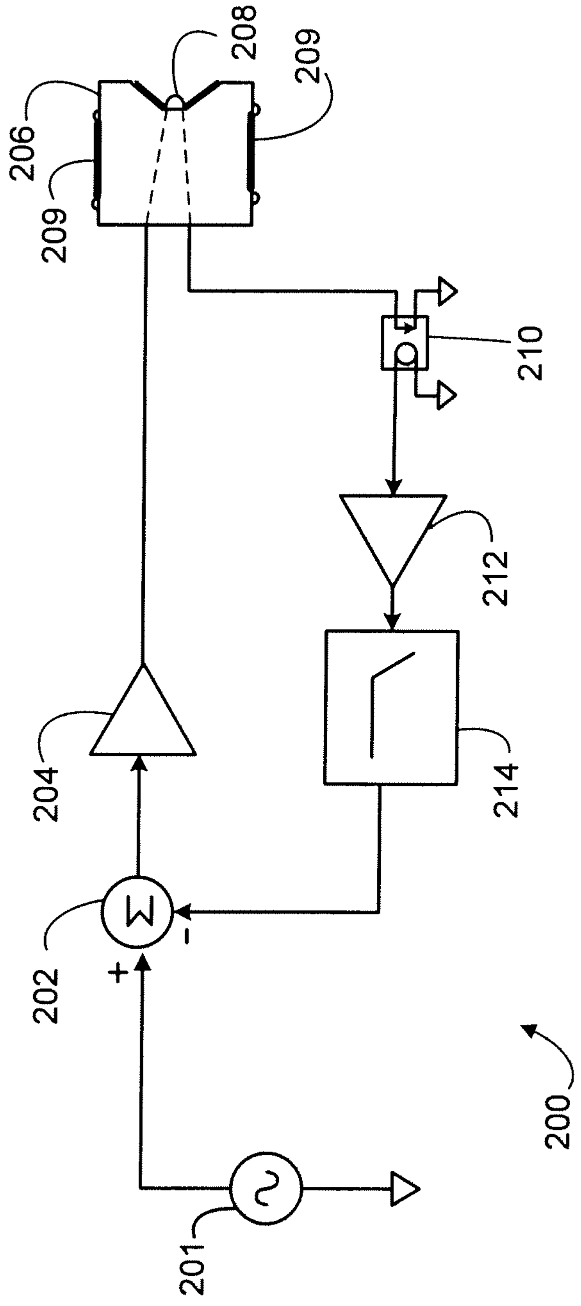
FIG. 2 is a block diagram of an audio system with feedback.

Referring to FIG. 2, there is shown a block diagram of audio system 200. The system in FIG. 2 is an analog system embodiment. Audio system 200 amplifies an audio signal and supplies it to a loudspeaker such as speaker module 100. Audio system 200 includes summing module 202, power amplifier 204, current sensor 210, amplifier 212, filter 214, drones 209, transducer 208, and enclosure 206. Audio system 200 also incorporates a circuit for modifying the effective output impedance of amplifier 204. Enclosure 206, drones 209, and transducer 208 together form one implementation of speaker module 100.

Audio system 200 accepts audio input signal 201 and couples it to one input of summer 202. The output of summer 202 is coupled to the input of amplifier 204. The output of amplifier 204 is coupled to transducer 208. Transducer 208 produces sound vibrations that reach the ears of the listener. Transducer 208 also causes air pressure variations within enclosure 206. These internal pressure variations cause motion in drones 209 so that drones 209 help provide the desired output from the audio system 200. An electrical feedback signal representing the current in transducer 208 is sensed by current sensor 210. The output of current sensor 210 is amplified by amplifier 212, filtered by filter 214, and is differentially coupled to a second input of summing module 202. By differentially coupling the current signal to summer 202, negative current feedback is applied to amplifier 204.

Power amplifier 204 applies gain to the input signal 201. In some embodiments, power amplifier 204 may be an analog amplifier. In some embodiments, power amplifier 204 may be a switching amplifier. In some embodiments, amplifier 204 may be of any known amplifier class, such as class A, AB, B, C, AD, BD, D, G, or T. Amplifiers may have unipolar or bipolar power supply voltages.

The system of FIG. 2 allows the output impedance of amplifier 204 to be controlled. The output impedance of amplifier 204 is a function of the current feedback applied. By varying the amplifier output impedance in a desired manner, effective damping of drone motion can be accomplished. Amplifier 212 and filter 214 may be configured to provide desired damping for drones 209, as will be described in detail below.

Figure 3:
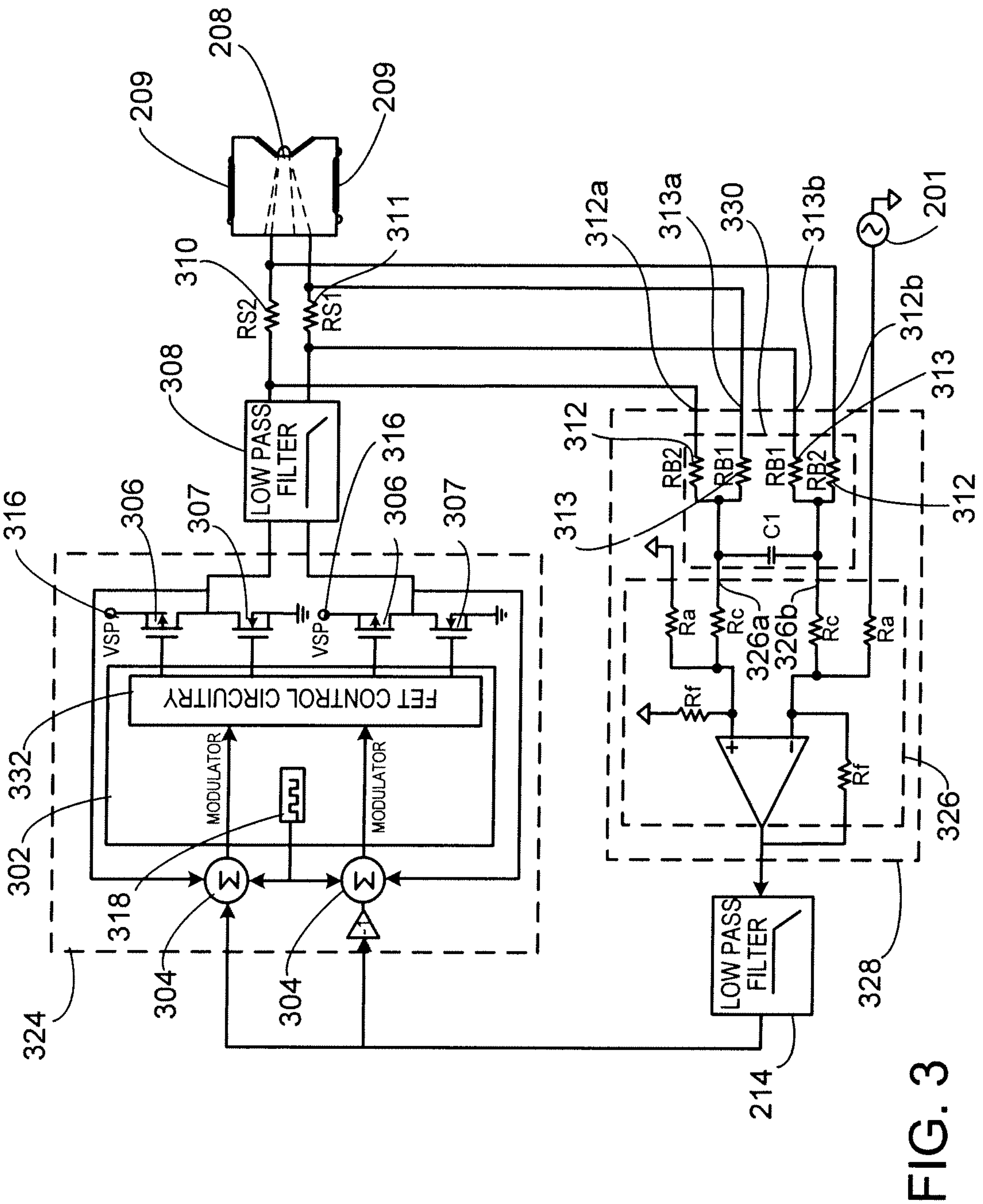
FIG. 3 is a electrical schematic drawing of an audio system with feedback.

Referring to FIG. 3, an electrical schematic drawing of another embodiment is shown. In this embodiment, the amplifier 204 of FIG. 2 is a switching type amplifier 324. Note that a simplified schematic representation of amplifier 324 is used. Switching amplifiers are well known, and any of a number of different switching amplifier types may be used. For clarity, only relevant details of the switching amplifier circuit have been shown.

The circuit of FIG. 3 includes switching power amplifier 324, output filter 308, sense resistors 310 and 311, summing module 328, RC network 330, and filter 214. Amplifier 324 contains modulator integrated circuit (IC) 302, summing modules 304, output switching P-channel transistors 306, and output switching N-channel transistors 307. The modulator IC 302 contains modulation oscillator 318 and FET control circuitry 332. Summing module 328 accepts signals that appear across sense resistors 310 and 311, which are representative of the current flowing through transducer 208, and applies them to input RC network 330 made up of resistors 312, 313, and C1. The output of RC network 330 is applied to differential summing amplifier 326, along with the input audio signal 201. The operation of RC network 330 and differential summing amplifier 326 are explained in more detail below. Summing modules 304 accept the combined audio and feedback signal output from filter 214 and combines it with the signal from the modulation oscillator 318. The combined output is used to construct signals to drive the output switching transistors. The output of the switching transistors is filtered by filter 308 before being applied to transducer 208.

Figure 4:
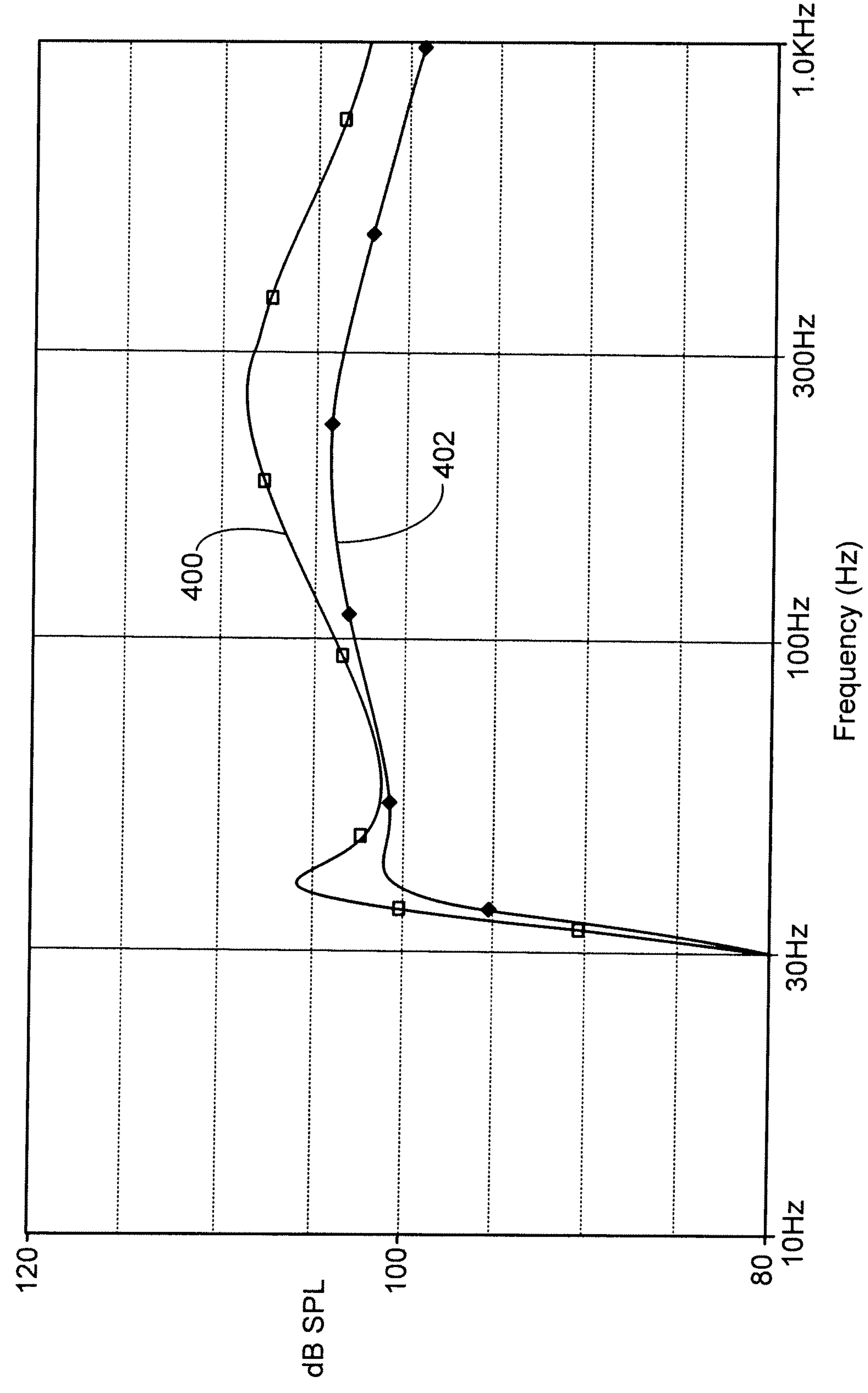
FIG. 4 is a graph of an audio output of an audio system vs. an audio frequency of an input signal.

In the implementation shown in FIG. 3, power amplifier 324 is a full-bridge, class BD switching amplifier operating from a single or unipolar voltage supply 316. A BD modulation (also known as carrier suppressed modulation and filter-free modulation) is preferable to minimize output filtering requirements. Filters 214 and 308 may be constructed to provide the desired frequency response. An example of a desired frequency response is shown in FIG. 4 as described below. Filter 308 has a response designed to block frequencies outside the audio band to reduce electromagnetic emissions in the radio frequency bands. Filter 214 aids in stability of the current feedback and reduces the bandwidth of the audio signal corresponding to the frequency range of the transducer thus reducing the output noise. Each output of power amplifier 324 will be at approximately 50% duty cycle with an average value of approximate half the supply voltage with no input signal (zero Volts) and will move equally in opposite directions with a change in input signal level. This average value becomes the reference voltage for the difference amplifier. The duty cycle of one amplifier output will increase while the duty cycle of the other amplifier output will decrease by a similar amount. The average voltage of one filter output will increase while the average output of the other filter output will decrease by a similar amount. When the input audio signal is zero volts, each output line of amplifier 324 switches between the power supply rail and ground with a duty cycle of approximately 50%. For large output signal levels the common mode voltage across each sense resistor 310 and 311 will change by a magnitude of approximately the supply voltage 316 with one sense resistor moving toward the supply voltage 316 and the other resistor moving toward the lower voltage rail. The value of the sense resistors 310 and 311 should be quite low to minimize power losses and preserve dynamic range of the audio signal. The low sense-resistor value results in a small sense voltage. Typically a high performance instrumentation grade differential amplifier with exceptional common mode range is used to amplify differential signals with large common mode variations and small differential mode levels, such as the signals across these sense resistors.

FIG. 3 also shows a sensing technique which reduces the effect of the common mode signal level on amplifier 326. Sense resistors 310 and 311 are used, with one in series with each speaker or load terminal. These sense resistors are connected to amplifier 326 by RC network 330 consisting of resistors 312 and 313 and capacitor C1. Resistors Rc, 312, 313, and Rf are used to set the current sense gain of amplifier 326. Resistors Ra and Rf are used to set the audio path gain of amplifier 326. Each input of amplifier 326 is connected to the sense resistors by resistors 312 and 313. Each of these resistors 312 and 313 are connected to a different sense resistor 310 and 311 and speaker terminal. Since each output of filter 308 will be at approximately half the supply voltage with no input signal and will move equally in opposite directions with a change in input signal level, the common mode signal level at each input of amplifier 326 will always be at approximately half the supply voltage. This sensing technique reduces the common mode level change and allows the use of conventional operational amplifiers with common mode input ranges smaller than the voltage range of the audio signal at either of the speaker terminals in a differencing configuration within summing module 328. For best operation in a differencing configuration, balance resistors 312 and 313 should be matched closely in value.

In some embodiments, one of the sense resistors 310 and 311 may be eliminated (reduced in value to 0 ohms). Eliminating one sense resistor does not significantly effect the common mode voltage stability. In such an embodiment, the benefit of small common mode swing is maintained with the burden of only one sense resistor rather than two and the change in gain can be compensated for by re-scaling other circuit values. The combined audio and sensed current signals from the output of amplifier 326 are fed through filter 214 which applies low pass filtering to reduce the feedback gain and aid with loop stability, and then to power amplifier 324, effecting negative feedback of the current signal. This configuration will create an essentially non-power dissipating synthesized output impedance for power amplifier 204 of 2*Rs*K1*K2, where Rs is the resistance of resistors 310 and 311 in ohms, K1 is the gain of power amplifier 324, and K2 is the gain of amplifier 326. This simplified synthesized output impedance equation assumes the gain of filters 214 and 308 are essentially unity, which is typically true over the effective frequency range of operation of the speaker module 100. Although it varies with audio frequency, the synthesized output impedance is always positive.

Current measurement may be made by resistor, Hall Effect, closed loop magnetic sensor, current sensing transformer, sensing Field Effect Transistor (senseFET). These alternative current sense devices may take the place of element 210 in FIG. 2. In FIG. 3, the alternative current sense devices would replace the sense resistors 310 and 311, and resistors 312 and 313.

In addition to filter 308, in some embodiments there may be filters added between the sensing resistors 310, 311 and the transducer 208.

The synthesized output impedance of audio system 200 is defined as the impedance measured across the two points where the transducer 208 connects to the electronic circuit. The synthesized output impedance may be in the range of 0.1 ohm to 100 ohms. In the implementation shown in FIG. 3, the amplifier synthesized output impedance may be designed to be equal to the transducer DC resistance. The output impedance will be in the tens of milliohms at low frequencies, and will increase as frequency is increased. The low voltage source output impedance of the typical amplifier decreases the drone damping causing it to have more excursion.

Referring to FIG. 4, there is shown a graph of audio output in dB SPL vs. frequency in Hz for one implementation of audio system 200 at 1 meter distance from transducer 208. The curves in FIG. 4 are calculated from a mathematical model of audio system 200 using known modeling techniques. Curve 400 shows the frequency response of audio system 200 without feedback, and curve 402 shows the frequency response of audio system 200 with negative current feedback. The shape of curves 400 and 402 depend on the parameters of the transducer used, and the details of the enclosure and secondary resonant element used. The shape of curve 402 also depends on the gain and frequency response of the current sensing circuit and filter 214 chosen for the audio system 200. Curve 402 is calculated assuming a positive synthesized amplifier output impedance that would result from application of negative current feedback. This synthesized output impedance in combination with the impedance of the transducer 208 provides increased electric damping for the drones 209. At the resonance frequency of the secondary resonant system (enclosure 206 and drone 209 of FIG. 2), the input impedance of the loudspeaker system 200 is a local minimum. When negative current feedback is applied, the relatively more current present in this frequency range results in a larger feedback signal, which then reduces the drive to the system relatively more in this frequency range than in ranges where the input impedance of the loudspeaker system is higher. Drive to the system is reduced at the resonant frequency of the drone with the enclosure, and drive to the drone is reduced (effectively lowering the Q of the drone enclosure resonance) by the application of negative current feedback. Curve 402 shows a flatter frequency response curve than curve 400 and is desirable for many applications.

Curve 400 has a high Q peak in the 39 Hz area corresponding to drone resonance. This peak can shift significantly with manufacturing variations in the acoustical and mechanical components of the speaker module. The peak is also likely to shift over the life of the speaker module. In order to achieve the desired frequency response with conventional equalization, each unit's amplifier would have to be custom equalized. These response variations make it impractical to use equalization processing to achieve the desired frequency response. By using current feedback, the system can compensate for variation in components and achieve a flattened response as speaker module parameters vary.

Figure 5:
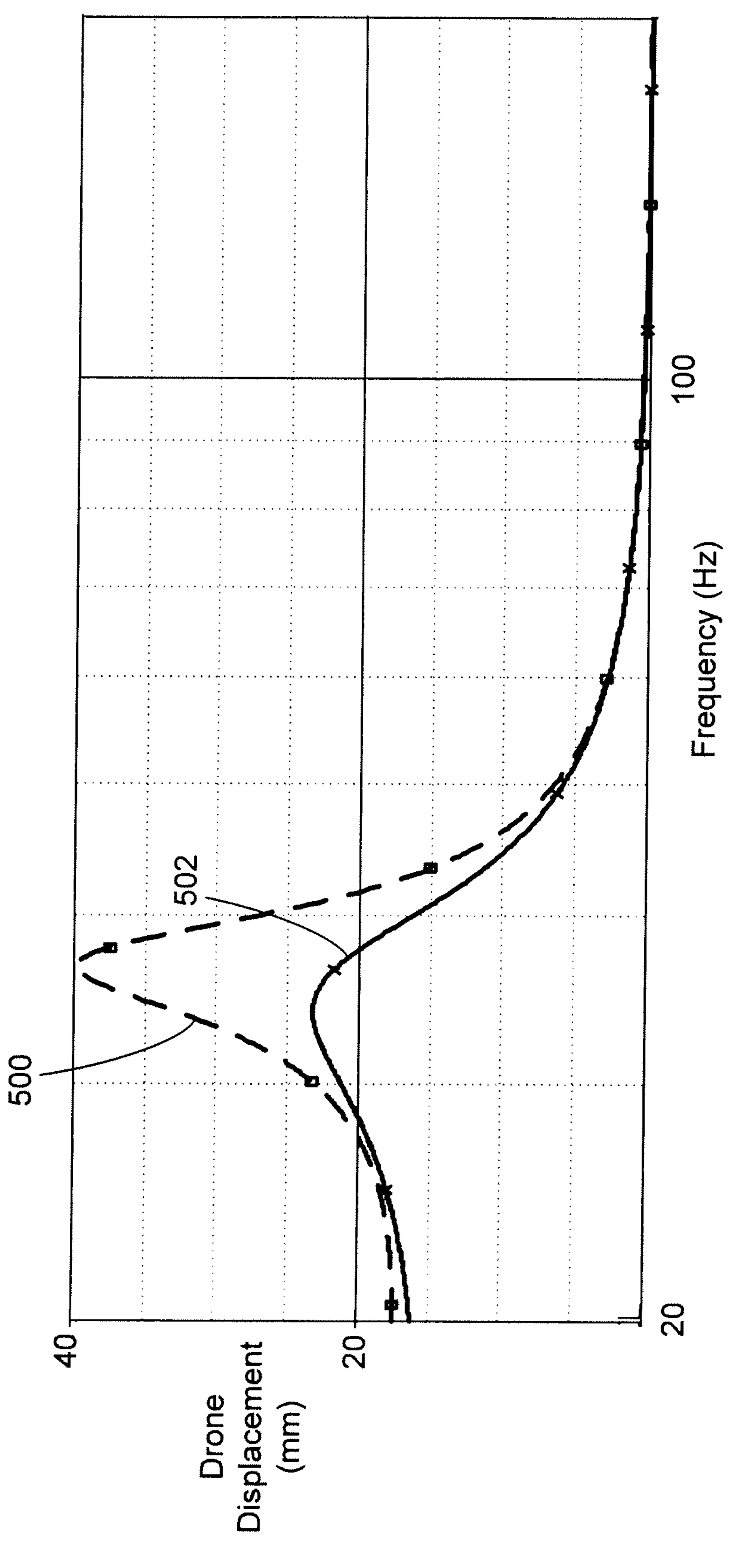
FIG. 5 is a graph of a drone motion of an audio system vs. an audio frequency of an input signal.

Referring to FIG. 5, there is shown a graph of the vibration displacement vs. frequency in Hz of drones 209 in millimeters from one implementation of audio system 200. The curves in FIG. 5 are also calculated from a mathematical model of audio system 200 using known modeling techniques. Curve 500 shows the displacement frequency response of a drone of audio system 200 without feedback, and curve 502 shows the displacement frequency response of a drone of audio system 200 with feedback. The shape of curves 500 and 502 depend on the parameters of the transducer used, and the details of the enclosure and secondary resonant element used. The shape of curve 502 also depends on the gain and frequency response of the current sensing circuit and filter 214 chosen for the audio system 200. As in FIG. 4, curve 502 shows reduced drone displacement around the drone fundamental resonance, compared to that of the system of curve 500.

The behavior of a loudspeaker system depends on the parameters of the transducer selected, and the parameters of the secondary resonant system. A designer may wish to develop a system with high efficiency and small size. To achieve this, a designer may select a transducer having a high motor force. When such a transducer is used in a system with a small enclosure, the result may be a peaked SPL output in the frequency range of the secondary system resonance. The secondary resonant system may have a high Q.

For systems where a secondary resonant system has high Q and a drone used as the secondary resonant element, the drone may be more easily overdriven at the secondary resonant frequency than at other frequencies. Overdriving occurs when the displacement of the drone's moving parts exceed the maximum intended displacement and the materials of the drone are deformed beyond their design targets. When overdriven, the drone may produce undesirable noises or it may be damaged. Systems with high Q's are easily overdriven. In order to avoid this overdriving condition, audio system 200 may increase its synthesized positive impedance so that the Q of the secondary resonant system is reduced. Increasing the output impedance by using negative current feedback can flatten the frequency response of the sound pressure output of the loudspeaker system around the secondary resonance, and also reduce displacement of the drone, improving reliability. When positive output impedance is synthesized for an embodiment where the amplifier is of a switching type, the frequency response is improved without affecting the system efficiency because no real power is dissipated in a physical impedance. Using the current-controlled synthesized output impedance technique allows drone damping control without the use of a power dissipating element. Because this is accomplished using a feedback system, the frequency response improvement is obtained if parameters of the transducer and secondary resonant system vary, either due to production tolerances or aging over time.

Other implementations are also within the scope of the following claims.

What is claimed is:

1. An electrical apparatus to sense current through a load comprising:

a first input terminal having a first input voltage relative to a reference;

a second input terminal having a second input voltage relative to the reference;

a first load terminal of the load having a first load voltage relative to the reference;

a second load terminal of the load having a second load voltage relative to the reference;

a first current sensing element connected between the first input terminal and the first load terminal; and a second current sensing element connected between the second input terminal and the second load terminal, wherein a first sense voltage is determined by a relationship between the first input voltage and the second load voltage and a second sense voltage is determined by a relationship between the second input voltage and the first load voltage.

2. The apparatus of claim 1 wherein the reference is selected from the group consisting of a circuit common, a circuit ground, and an earth connection.

3. The apparatus of claim 1 wherein the first current sensing element is a resistive element.

4. The apparatus of claim 1 wherein the first current sensing element has essentially zero resistance.

5. The apparatus of claim 1 further comprising a set of two resistive elements that form a voltage divider wherein the first sense voltage is sensed by the voltage divider.

6. The apparatus of claim 5 wherein the two resistive elements have approximately equal resistance.

7. The apparatus of claim 1 wherein the first input voltage and the second input voltage have a substantially constant common mode voltage.

8. The apparatus of claim 1 wherein the average of the first input voltage and the second input voltage is substantially constant over a range of operation.

9. The apparatus of claim 1 further comprising a voltage difference amplifier wherein the voltage difference amplifier senses the difference of the first sense voltage and the second sense voltage.

10. The apparatus of claim 9 wherein the voltage difference amplifier has a common mode range smaller than the voltage range of the first input voltage.

11. The apparatus of claim 1 further comprising a bridge amplifier with a set of bridge amplifier outputs wherein the first input voltage and the second input voltage are derived from the set of bridge amplifier outputs.

12. The apparatus of claim 1 further comprising a filter wherein the set of bridge amplifier outputs are modified by the filter and coupled to the first input terminal and the second input terminal.

13. The apparatus of claim 1 wherein the load comprises a transducer.

14. The apparatus of claim 1 further comprising an audio amplifier.

15. The apparatus of claim 14 wherein the audio amplifier comprises a switching amplifier.

16. The apparatus of claim 1 wherein the load comprises a transducer coupled to a bass reflex enclosure.

17. The apparatus of claim 1 wherein the load comprises a transducer coupled to a waveguide enclosure.

18. The apparatus of claim 1 further comprising an electrical filter module coupling the first current sensing element to the load.

* * * * *